(12) United States Patent
Tan et al.

(10) Patent No.: US 11,982,938 B2
(45) Date of Patent: May 14, 2024

(54) IMPRINT TEMPLATE, PREPARATION METHOD THEREOF AND IMPRINT METHOD

(71) Applicant: BOE TECHNOLOGY GROUP CO., LTD., Beijing (CN)

(72) Inventors: Wei Tan, Beijing (CN); Kang Guo, Beijing (CN); Xin Gu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 341 days.

(21) Appl. No.: 16/772,964

(22) PCT Filed: Oct. 17, 2019

(86) PCT No.: PCT/CN2019/111659
§ 371 (c)(1),
(2) Date: Jun. 15, 2020

(87) PCT Pub. No.: WO2020/098445
PCT Pub. Date: May 22, 2020

(65) Prior Publication Data
US 2021/0165317 A1   Jun. 3, 2021

(30) Foreign Application Priority Data

Nov. 16, 2018  (CN) .......................... 201811366008.4

(51) Int. Cl.
*G03F 7/00* (2006.01)
*B29C 59/02* (2006.01)
(Continued)

(52) U.S. Cl.
CPC .......... *G03F 7/0002* (2013.01); *B29C 59/022* (2013.01); *B32B 37/12* (2013.01); *B32B 2037/1276* (2013.01); *B82Y 40/00* (2013.01)

(58) Field of Classification Search
CPC ..... G03F 7/0002; B29C 59/022; B29C 33/42; B29C 33/428; B29C 2033/422; B29C 2033/426
See application file for complete search history.

(56) References Cited

U.S. PATENT DOCUMENTS

| | | | |
|---|---|---|---|
| 2004/0168586 A1 | 9/2004 | Bailey et al. | |
| 2013/0098869 A1* | 4/2013 | Yu | B82Y 10/00 216/49 |

(Continued)

FOREIGN PATENT DOCUMENTS

| | | |
|---|---|---|
| CN | 101183214 A | 5/2008 |
| CN | 102157642 A | 8/2011 |

(Continued)

OTHER PUBLICATIONS

First Office Action dated Dec. 12, 2019 for application No. CN201811366008.4 with English translation attached.

*Primary Examiner* — Larry W Thrower
*Assistant Examiner* — John W Hatch
(74) *Attorney, Agent, or Firm* — Nath, Goldberg & Meyer; Joshua B. Goldberg (57) ABSTRACT

The present disclosure provides an imprint template, including: a base substrate, a pattern layer for imprinting and a planarization layer; wherein the planarization layer is located on a surface of the pattern layer facing away from the base substrate, and a surface of the planarization layer facing away from the base substrate is a plane; and the planarization layer and the pattern layer are configured such that under a specific film removing process, the planarization layer is removed while the pattern layer remains. The present disclosure further provides a preparation method of an imprint template, and an imprint method.

5 Claims, 5 Drawing Sheets

(51) Int. Cl.
*B32B 37/12* (2006.01)
*B82Y 40/00* (2011.01)

(56) References Cited

U.S. PATENT DOCUMENTS

| | | | |
|---|---|---|---|
| 2013/0177598 A1* | 7/2013 | Desimone | G03F 7/0002 |
| | | | 424/94.1 |
| 2017/0136505 A1* | 5/2017 | Yamaguchi | B08B 3/12 |
| 2017/0261806 A1* | 9/2017 | Niu | G02F 1/1368 |
| 2018/0104888 A1* | 4/2018 | Ye | B29C 59/022 |
| 2019/0283280 A1* | 9/2019 | Verschuuren | B29C 33/405 |
| 2019/0329457 A1* | 10/2019 | Miyake | G03F 7/0002 |

FOREIGN PATENT DOCUMENTS

| | | |
|---|---|---|
| CN | 105511223 A | 4/2016 |
| CN | 109445247 A | 3/2019 |
| NL | 2003380 A | 4/2010 |
| WO | 03073164 A2 | 9/2003 |

* cited by examiner

IMPRINT TEMPLATE, PREPARATION METHOD THEREOF AND IMPRINT METHOD

CROSS-REFERENCE TO RELATED APPLICATION

This is a National Phase Application filed under 35 U.S.C. 371 as a national stage of PCT/CN2019/111659, filed Oct. 17, 2019, an application claiming the benefit of Chinese Application No. 201811366008.4, filed Nov. 16, 2018, the content of each of which is hereby incorporated by reference in its entirety.

TECHNICAL FIELD

The present disclosure relates to the field of display technologies, and in particular relates to an imprint template, a preparation method thereof and an imprint method.

BACKGROUND

When a nano-imprinting process is carried out, surface flatness of imprint glue on the substrate to be processed has a direct influence on the imprinting effect. Specifically, if there is a segment difference on the surface of the imprint glue, the imprint glue may fall off in a large area and the imprint pattern may be distorted and deformed when the imprint glue is removed from the template.

SUMMARY

Embodiments of the disclosure provide an imprint template, a preparation method thereof and an imprint method.

At least one embodiment of the disclosure provides an imprint template, including: a base substrate, a pattern layer for imprinting and a planarization layer; wherein the planarization layer is located on a surface of the pattern layer facing away from the base substrate, and a surface of the planarization layer facing away from the base substrate is a plane; and the planarization layer and the pattern layer are configured such that under a specific film removing process, the planarization layer is removed while the pattern layer remains.

In some embodiments, a material of the planarization layer includes: a water soluble material or a degradable material.

In some embodiments, the water soluble material includes: at least one of a polyvinyl alcohol resin and a polycaprolactone resin; and the degradable material includes: a degradable imprint glue.

In some embodiments, the imprint template further includes: a buffer layer; wherein the buffer layer is located between the base substrate and the pattern layer.

At least one embodiment of the disclosure provides a preparation method of an imprint template, including: forming a pattern layer for imprinting on a base substrate; forming a planarization layer on a side of the pattern layer facing away from the base substrate, a surface of the planarization layer facing away from the base substrate being a plane; and wherein the planarization layer and the pattern layer are configured such that under a specific film removing process, the planarization layer is removed while the pattern layer remains.

In some embodiments, the step of forming the pattern layer on the base substrate includes: forming a template glue on a side surface of the base substrate through a coating process; patterning a side of the template glue facing away from the base substrate with a cavity template; curing the template glue to form the pattern layer; and separating the cavity template from the pattern layer.

In some embodiments, the step of forming the planarization layer on the side of the pattern layer facing away from the base substrate includes: forming a planarization material film on a surface of the pattern layer facing away from the base substrate through the coating process; flattening a side of the planarization material film away from the base substrate with a flattening template; curing the planarization material film to form the planarization layer; and separating the flattening template from the planarization layer.

In some embodiments, the step of forming the planarization layer on the side of the pattern layer facing away from the base substrate includes: forming a planarization material film on a surface of the pattern layer facing away from the base substrate through the coating process; and leaving the planarization material film standing for a predetermined period of time, and then curing the planarization material film.

In some embodiments, before the step of forming the pattern layer on the base substrate, the method further includes: forming a buffer layer on the base substrate.

At least one embodiment of the disclosure provides an imprint method, the imprint method is based on the imprint template as described above and includes: imprinting an imprint glue by the planarization layer of the imprint template to flatten a surface of the imprint glue; removing the planarization layer through a specific film removing process to expose the pattern layer; and imprinting the imprint glue by the pattern layer of the imprint template to pattern the imprint glue.

In some embodiments, when the material of the planarization layer includes a water soluble material, the step of removing the planarization layer through a specific film removing process includes: dissolving the planarization layer with an aqueous solvent; and when the material of the planarization layer includes a degradable material, the step of removing the planarization layer through a specific film removing process includes: degrading the planarization layer through a degradation process.

In some embodiments, after the step of removing the planarization layer through a specific film removing process, the method further includes: drying the imprint template.

DETAILED DESCRIPTION OF THE EMBODIMENTS

To improve understanding of the technical solution of the present disclosure for those skilled in the art, the imprint template, the preparation method thereof and the imprint method according to the present disclosure will be described below in detail in conjunction with the accompanying drawings.

Example embodiments will be described more sufficiently below with reference to the accompanying drawings, but which may be embodied in different forms and should not be construed as limited to the embodiments set forth herein. Rather, these embodiments are provided so that this disclosure will be thorough and complete, and will fully convey the scope of the disclosure to those skilled in the art.

The terminology used herein is for the purpose of describing specific embodiments only and is not intended to limit the disclosure. As used herein, the singular forms "a", "an" and "the" are intended to include the plural forms as well, unless the context clearly indicates otherwise. It will be further understood that as used herein, the terms "comprise" and/or "consist of . . . " specify the presence of stated features, integers, steps, operations, elements, and/or components, but do not preclude the presence or addition of one or more other features, integers, steps, operations, elements, components, and/or groups thereof.

Embodiments described herein may be described with reference to plan and/or cross-sectional views in idealized representations of the present disclosure. Accordingly, the example illustrations may be modified in accordance with manufacturing techniques and/or tolerances. Accordingly, the embodiments are not limited to the embodiments shown in the drawings, but include modifications of configurations formed based on a manufacturing process. Thus, the regions illustrated in the figures have schematic properties, and the shapes of the regions shown in the figures illustrate specific shapes of regions of elements, but are not intended to be limiting.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the related art and the present disclosure, and will not be interpreted in an idealized or overly formal sense unless expressly so defined herein.

In prior art, a current solution for the above problem is to additionally provide a blank template with a plan surface (without pattern). Before the imprinting process is carried out, the surface of the imprint glue is flattened with the blank template, and then the imprint glue is patterned with the imprint template. Therefore, in the existing nano-imprinting process, two separate templates need to be prepared in advance: a blank template with no pattern on the surface and an imprint template with a pattern on the surface.

Figure 1:
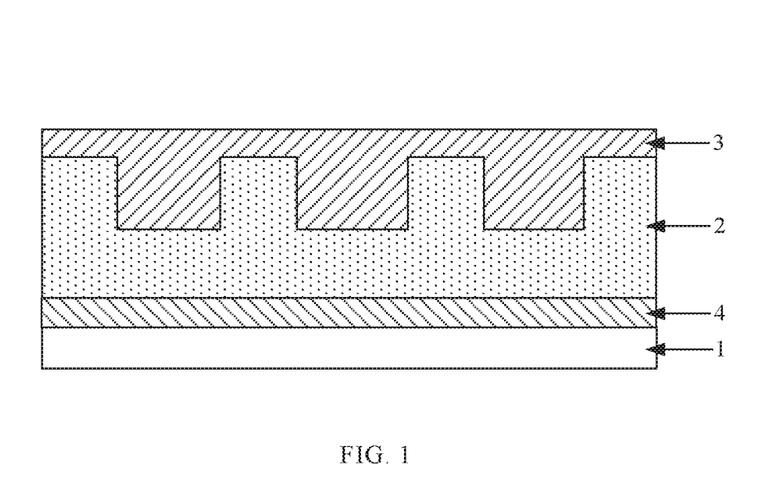
FIG. 1 is a schematic cross-sectional view of an imprint template provided by an embodiment of the disclosure.

FIG. 1 is a schematic cross-sectional view of an imprint template provided by an embodiment of the disclosure. As shown in FIG. 1, the imprint template includes: a base substrate 1, a pattern layer 2 for imprinting and a planarization layer 3.

The base substrate 1 may be a rigid substrate or a flexible substrate, and the present disclosure does not limit properties such as material and shape of base substrate 1.

The pattern layer 2 is disposed on the base substrate 1, and a set pattern is formed on a side (i.e., an imprint surface) of the pattern layer facing away from the base substrate 1 and used for patterning an imprint glue 5 on a substrate to be processed in an imprinting process. In the present disclosure, a material of the pattern layer 2 includes: an acrylate resin and an epoxy resin, and the pattern layer 2 is not water soluble or degradable.

The planarization layer 3 is located on a surface of the pattern layer 2 facing away from the base substrate 1, and a surface of the planarization layer 3 facing away from the base substrate 1 is a plane. It should be noted that the planarization layer 3 of the present disclosure has a certain thickness and may completely cover the surface of the pattern layer 2.

In addition, considering that the surface of the planarization layer 3 facing away from the base substrate 1 cannot be absolute flat in practical applications, "plane" in the present disclosure refers to a surface having a flatness (an absolute value of a difference in height between an uneven point on the surface and an absolute level) less than a predetermined threshold; where the predetermined threshold may be set to 20 nm (i.e., the surface of the planarization layer 3 facing away from the base substrate 1 has a flatness less than 20 nm). Obviously, the predetermined threshold may also be adjusted as needed.

The planarization layer 3 and the pattern layer 2 are configured such that under a specific film removing process, the planarization layer 3 is removed while the pattern layer 2 remains.

The imprint template provided by the present disclosure can be used for flattening a surface of the imprint glue 5 on the substrate to be processed and for patterning the imprint glue 5. Compared with the related art, the technical solution of the present disclosure can reduce the number of templates used in the nano-imprinting process.

A specific process of performing a nano-imprinting process using the imprint template provided by the present disclosure will be described in detail below with reference to the accompanying drawings.

Figure 2:
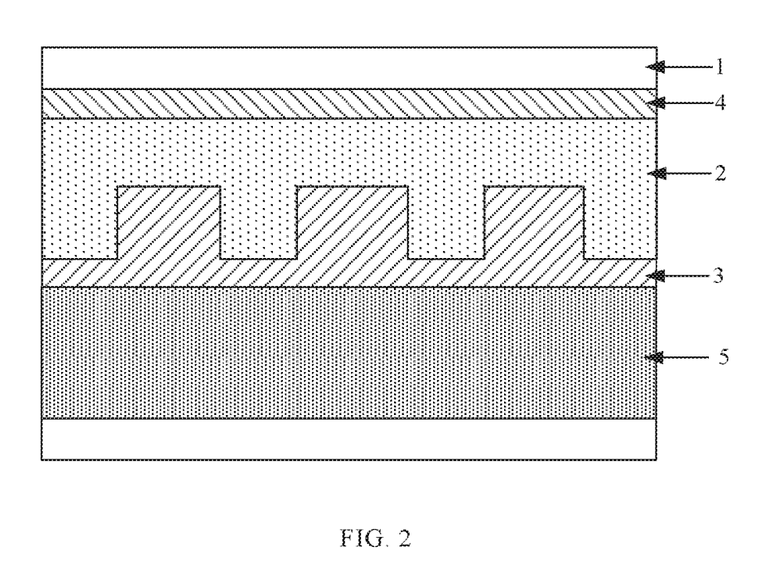
FIG. 2 is a schematic cross-sectional view showing flattening a surface of the imprint glue with a planarization layer of the imprint template according to the present disclosure.

First, the imprint glue 5 is imprinted by the planarization layer 3 in the imprint template to flatten a surface of the imprint glue 5.

FIG. 2 is a schematic cross-sectional view showing flattening the surface of the imprint glue 5 with the planarization layer 3 in the imprint template according to the present disclosure. As shown in FIG. 2, the plane surface of the planarization layer 3 facing away from the base substrate 1 is directly opposite to the imprint glue 5, and then the imprint glue 5 is undergone a first imprint by the imprint template to flatten the surface of the imprint glue 5.

Figure 3:
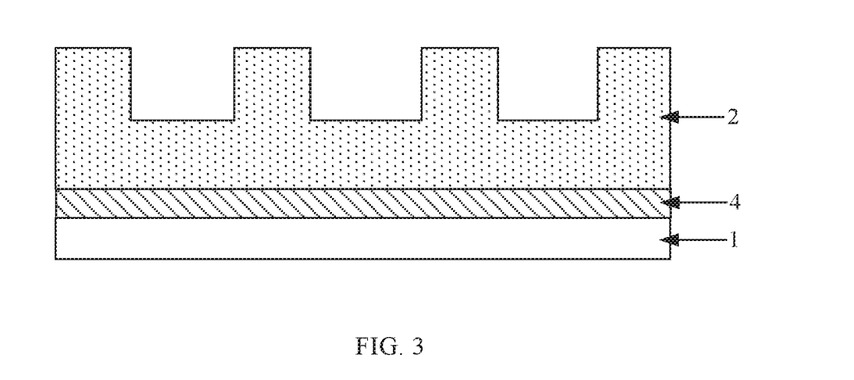
FIG. 3 is a schematic cross-sectional view showing removing the planarization layer in the imprint template through a specific film removing process according to the present disclosure.

Then, the planarization layer 3 is removed through a specific film removing process to expose the pattern layer 2.

FIG. 3 is a schematic cross-sectional view showing removing the planarization layer in the imprint template through a specific film removing process according to the present disclosure. As shown in FIG. 3, the planarization layer 3 is processed through a specific film removing process so that the planarization layer 3 is removed and then the pattern layer 2 covered by the planarization layer 3 is exposed.

As an alternative implementation, a material of the planarization layer 3 includes: a water soluble material. In this case, the imprint template may be rinsed with an aqueous solvent in which the planarization layer 3 dissolves, and the pattern layer 2 remains. Further optionally, the water soluble material includes at least one of a polyvinyl alcohol resin and a polycaprolactone resin.

As another alternative implementation, the material of the planarization layer 3 includes: a degradable material. In this case, the planarization layer 3 is degraded through a degradation process, and the pattern layer 2 remains. Further optionally, the degradable material includes: a degradable imprint glue. The degradable imprint glue specifically includes a degradable resin.

Figure 4:
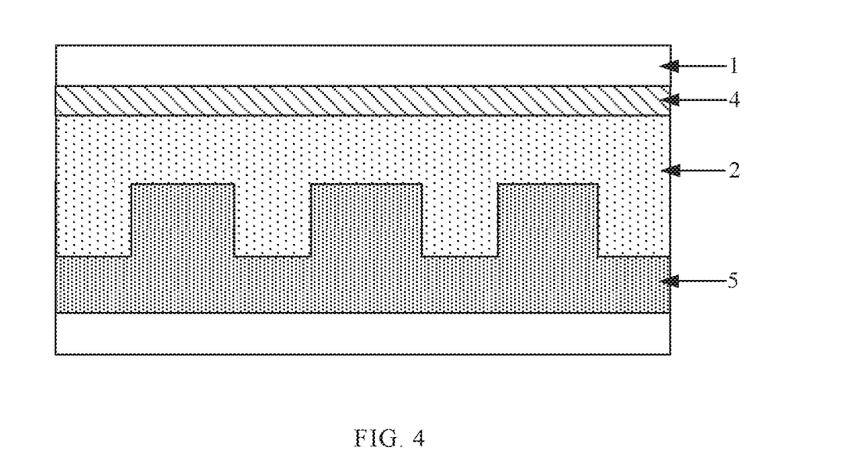
FIG. 4 is a schematic cross-sectional view showing patterning the surface of the imprint glue with a pattern layer in the imprint template according to the present disclosure.

Next, the imprint glue 5 is imprinted by the pattern layer 2 of the imprint template to be patterned.

FIG. 4 is a schematic cross-sectional view showing patterning the surface of the imprint glue with a pattern layer in the imprint template according to the present disclosure. As shown in FIG. 4, a patterned surface of the pattern layer 2 facing away from the base substrate 1 is directly opposite to the imprint glue 5, and then the imprint glue 5 is undergone a secondary imprint by the imprint template to be patterned.

Finally, the imprint glue 5 is cured, and the imprint template is separated from the cured imprint glue 5.

As can be seen from the above, in the solution provided by the present disclosure, only one imprint template is needed to perform flattening and patterning on the surface of the imprint glue 5.

Preferably, the imprint template further includes: a buffer layer 4 located between the base substrate 1 and the pattern layer 2. The buffer layer 4 has good elasticity and can be used to absorb a stress generated during the imprinting process. Optionally, a material of the buffer layer 4 includes: polydimethylsiloxane.

Figure 5:
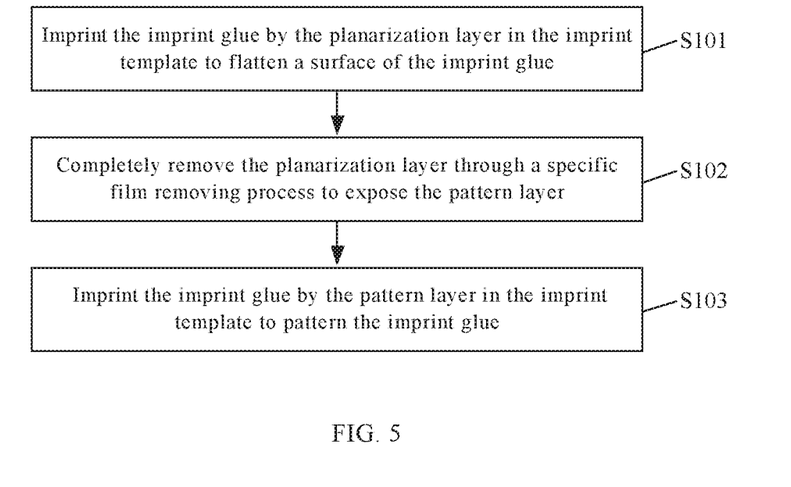
FIG. 5 is a flowchart of an imprint method provided by an embodiment of the present disclosure.

FIG. 5 is a flowchart of an imprint method provided by an embodiment of the present disclosure. As shown in FIG. 5, the imprint method is based on the imprint template provided in the foregoing embodiments, and includes the following steps S101 to S103.

At step S101, the imprint glue is imprinted by the planarization layer in the imprint template to flatten a surface of the imprint glue.

At step S102, the planarization layer is removed through a specific film removing process to expose the pattern layer.

As an alternative implementation, when the material of the planarization layer 3 includes a water soluble material, the step S102 specifically includes: dissolving the planarization layer 3 with an aqueous solvent.

As an alternative implementation, when the material of the planarization layer 3 includes a degradable material, the step S102 specifically includes: degrading the planarization layer 3 through a degradation process. For example, the degradable material includes a degradable imprint glue that contains a ketal or acetal group, and the ketal or acetal functional group in the cross-linking group is unstable under weak acid conditions after the degradable imprint glue is cured. In step S102, the imprint template may be placed in a weak acid environment (e.g., immersed in a weak acid solution) so that the cross-linking group is hydrolyzed under the weak acid condition, the cross-linking bonds are broken, and the insoluble network structure is changed into a soluble linear structure, thereby achieving the purpose of degradation.

After dissolving the planarization layer 3 with an aqueous solvent or degrading the planarization layer 3 through a degradation process, some water may be left on the surface of the imprint template. In order to avoid the influence of the water left on the surface of the imprint template on the subsequent process, in the embodiment, it is preferred that the imprint template is dried after the planarization layer 3 is removed; for example, by purging the surface of the imprint template with nitrogen.

At step S103, the imprint glue is imprinted by the pattern layer of the imprint template to pattern the imprint glue.

For detailed description of the above steps S101 to S103, reference may be made to FIGS. 2 to 4 and corresponding contents in the foregoing embodiments and details are not repeated here.

Figure 6:
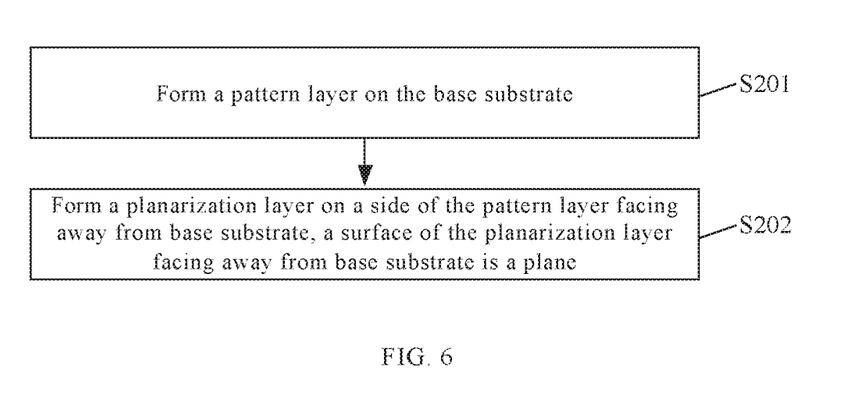
FIG. 6 is a flowchart of a preparation method of an imprint template provided by an embodiment of the disclosure.

FIG. 6 is a flowchart of a preparation method of an imprint template provided by an embodiment of the disclosure. As shown in FIG. 6, the preparation method is used for preparing an imprint template provided in the foregoing embodiments, and includes the following steps S201 to S202.

At step S201, a pattern layer is formed on the base substrate.

As an alternative implementation, a material of the base substrate 1 includes Polyethylene Terephthalate (PET) of a thickness 0.05 mm to 0.5 mm. In this case, the base substrate 1 is a flexible transparent substrate, and has a light transmittance close to 89%.

In step S201, a template glue is firstly coated on the surface of the base substrate 1. The template glue includes a monomer, a prepolymer, a photoinitiator, and other additives, and the main resin of the template glue is an acrylate resin, an epoxy resin, or the like, with a coating thickness of 3 um to 4 um. The coating method includes, but is not limited to, spin coating, slot coating, inkjet printing and slot-die coating. Then, the template glue is imprinted by a cavity template 6, and the patterned template glue is cured and demolded to obtain the pattern layer 2 for imprinting.

It should be noted that when the cavity template 6 is used to imprint the template glue, a roll-to-plate imprinting process may be adopted. When curing the template glue, a thermal curing or ultraviolet curing process may be adopted.

Figure 7:
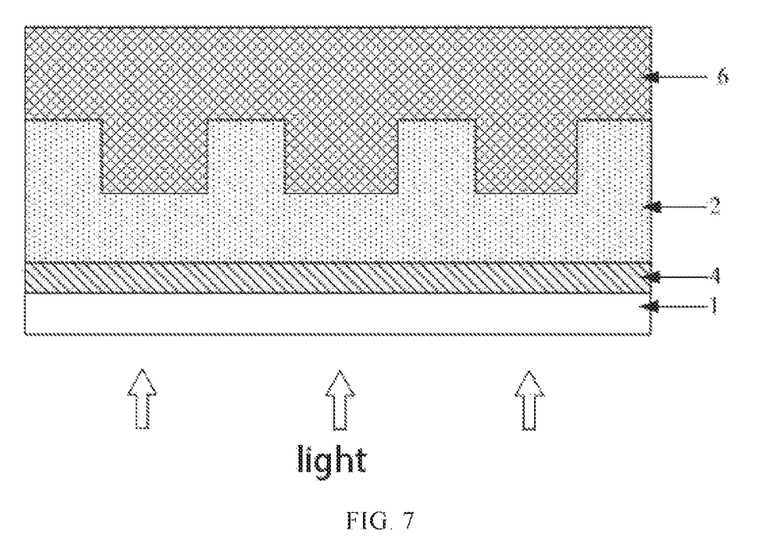
FIG. 7 is a schematic cross-sectional view showing curing the template glue through an ultraviolet curing process.

FIG. 7 is a schematic cross-sectional view showing curing the template glue through an ultraviolet curing process. As shown in FIG. 7, when an ultraviolet curing process is adopted to cure the template glue, light for curing is irradiated to the template glue through the base substrate 1 side, and the exposure energy is 3000 mj/cm$^2$-5000 mj/cm$^2$. After the template glue is completely cured, the cavity template 6 may be separated from the template glue.

At step S202, a planarization layer is formed on a side of the pattern layer facing away from the base substrate, a surface of the planarization layer facing away from the base substrate being a plane.

The material of the planarization layer 3 includes a water soluble material or a degradable material. Optionally, the water soluble material includes: at least one of a polyvinyl alcohol resin and a polycaprolactone resin; and the degradable material includes: a degradable imprint glue.

As an alternative implementation of step S202, a planarization material film is firstly formed on a surface of the pattern layer 2 facing away from the base substrate 1 through a coating process, where the coating thickness is 3 μm to 10 μm, and the coating method includes, but is not limited to, spin coating, slot coating, inkjet printing and slot-die coating. Then, the planarization material film is left standing for a predetermined period of time so that the surface of the planarization material film tends to be flat under an action of the self-gravity of the planarization material film and the molecular force between molecules therein. Next, the planarization material film is cured, where the curing process may be performed through a thermal curing process or an ultraviolet curing process. The predetermined period of time is in a range of 1 to 2 min.

Figure 8:
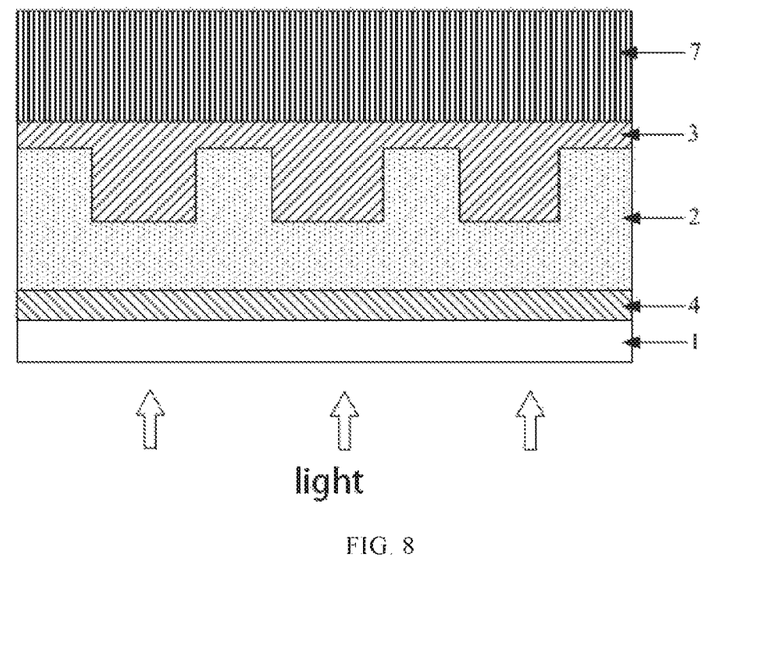
FIG. 8 is a schematic cross-sectional view showing flattening a side of the planarization material film facing away from the base substrate with a flattening template.

FIG. 8 is a schematic cross-sectional view showing flattening a side of the planarization material film facing away from the base substrate with a flattening template. As shown in FIG. 8, as another alternative implementation of step S202, a planarization material film is firstly formed on a surface of the pattern layer 2 facing away from the base substrate 1 through a coating process. Then, a flattening template 7 (with a plane imprint surface) is used for flattening a side of the planarization material film facing away from the base substrate 1. Next, the planarization material film is cured to form the planarization layer 3, where the curing process may be performed through a thermal curing process or an ultraviolet curing process. Finally, the flattening template 7 is separated from the planarization layer 3.

When the ultraviolet curing process is adopted for curing, light for curing is irradiated to the planarization material film through the base substrate 1 side, and after the planarization material film is completely cured, the flattening template 7 may be separated from the planarization material film.

Figure 9:
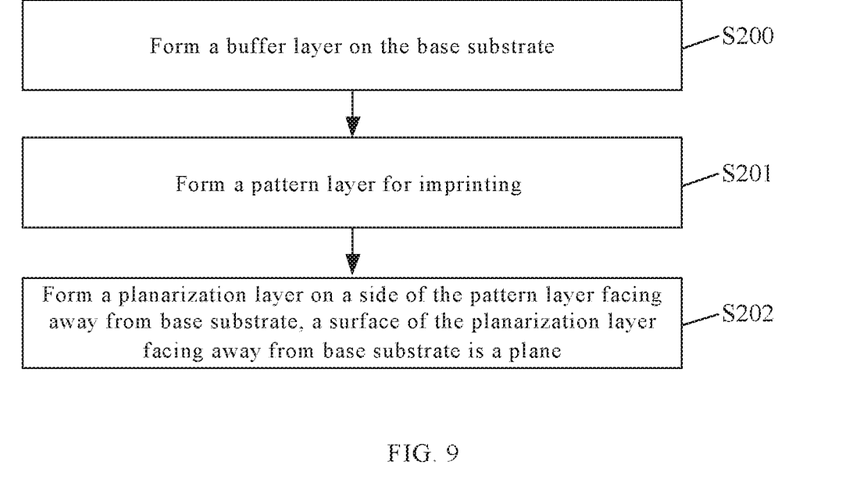
FIG. 9 is a flowchart of another preparation method of an imprint template provided by an embodiment of the disclosure.

FIG. 9 is a flowchart of another preparation method of an imprint template provided by an embodiment of the disclosure. As shown in FIG. 9, the preparation method of this embodiment includes not only steps S201 to S202 of the above embodiment, but also S200 which is performed before step S201. Only step S200 will be described in detail below.

At step S200, a buffer layer is formed on the base substrate.

In step S200, a Polydimethylsiloxane (PDMS) mixture is firstly coated on the surface of the base substrate 1, where the mixture contains a PDMS matrix and a curing agent, and the coating thickness is 1 μm to 0.5 mm. Then, the PDMS mixture is cured to form the buffer layer 4 that has good elasticity and high light transmittance. The high light transmittance of the buffer layer 4 can facilitate the subsequent ultraviolet curing treatment of the template glue or the planarization material film on base substrate 1 side.

The imprint template prepared by the preparation method of the present disclosure can be used for flattening a surface of the imprint glue on the substrate to be processed and for patterning the imprint glue.

It will be appreciated that the above implementations are merely exemplary implementations for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. An imprint method, wherein the imprint method is based on an imprint template, and the imprint template comprises: a base substrate, a pattern layer for imprinting, and a planarization layer; wherein the planarization layer is located on a surface of the pattern layer facing away from the abase substrate, and a surface of the planarization layer facing away from the base substrate is a plane;

the planarization layer and the pattern layer are configured such that under a specific film removing process, the planarization layer is removed while the pattern layer remains;

the planarization layer completely covers an entire surface of the pattern layer facing away from the base substrate;

the layer is for imprinting an imprint glue after the planarization layer is removed; and a material of the planarization layer comprises: a water soluble material or a degradable material, wherein the imprint method sequentially comprises:

imprinting the imprint glue by the planarization layer of the imprint template to flatten a surface of the imprint glue;

removing the planarization layer through a film removing process to expose the pattern layer; and imprinting the imprint glue by the pattern layer of the imprint template to pattern the imprint glue, wherein when the material of the planarization layer comprises a water soluble material, the step of removing the planarization layer through a film removing process comprises: dissolving the planarization layer with an aqueous solvent; and when the material of the planarization layer comprises a degradable material, the step of removing the planarization layer through a film removing process comprises: degrading the planarization layer through a degradation process.

2. The imprint method according to claim 1, wherein the imprint template further comprises: a buffer layer; wherein the buffer layer is located between the base substrate and the pattern layer.

3. The imprint method according to claim 1, wherein after the step of removing the planarization layer through a film removing process, the method further comprises:

drying the imprint template.

4. The imprint method according to claim 1, wherein the water soluble material comprises at least one of a polyvinyl alcohol resin and a polycaprolactone resin.

5. The imprint method according to claim 1, wherein the degradable material comprises a degradable imprint glue.

* * * * *